(12) United States Patent
Christensen (10) Patent No.: US 6,794,977 B2
(45) Date of Patent: Sep. 21, 2004

(54) PLANAR TRANSFORMERS

(75) Inventor: Kaare Tais Christensen, Copenhagen (DK)

(73) Assignee: Nokia Corportation, Espoo (FI)

( * ) Notice: Subject to any disclaimer, the term of this patent is extended or adjusted under 35 U.S.C. 154(b) by 0 days.

(21) Appl. No.: 09/976,074

(22) Filed: Oct. 15, 2001

(65) Prior Publication Data

US 2003/0071706 A1 Apr. 17, 2003

(51) Int. Cl.$^7$ ................................................ H01F 5/00
(52) U.S. Cl. ..................................... 336/200; 336/232
(58) Field of Search ......................... 336/173, 180–183, 336/186, 187, 200, 220, 232; 333/24 R–25

(56) References Cited

U.S. PATENT DOCUMENTS 4,816,784 A * 3/1989 Rabjohn .................... 333/24 R

\* cited by examiner

*Primary Examiner*—Tuyen T. Nguyen
(74) *Attorney, Agent, or Firm*—Antonelli, Terry, Stout & Kraus, LLP (57) ABSTRACT

In a planar transformer, at least a portion of each of the windings are intermingled in an intermingled portion. Within the intermingled portion, each full turn of each winding is effected by one self-crossing and two crossings of each other winding having turns in said intermingled portion. The windings may be formed in the conductor layers of an integrated circuit.

15 Claims, 10 Drawing Sheets

PLANAR TRANSFORMERS

FIELD OF THE INVENTION

The present invention relates to transformer structures suitable for integrated circuits.

BACKGROUND TO THE INVENTION

On-chip transformers are relatively rare in silicon RF integrated circuits and make use of a few well-known layout techniques, e.g. placing the primary and secondary windings one above the other in different interconnect layers. While some of these techniques ensure symmetry in the sense that the primary and secondary parts are identical. Generally, however, the two inductors are not balanced.

A more symmetrical layout comprises inward and outward spiralling paths which cross twice in all but the outer and inner turns which contain only one crossing. Transformers employing such symmetrical inductors are shown in Simburger, W. et al., "A Monolithic 3.7W Silicon Power Amplifier with 59% PAE at 0.9 GHz", 1999 IEEE International Solid-State Circuits Conference, TP 13.6. These transformers comprise the turns of each inductor arranged in one or more blocks, which are arranged coaxially.

The Simburger transformers have a complex layout and are undesirably lossy. Furthermore, it is difficult to match the electrical properties of the windings.

SUMMARY OF THE INVENTION

It is an object of the present invention to provide an improved substantially planar transformer suitable for use in integrated circuits.

According to the present invention, there is provided a substantially planar transformer comprising a plurality of windings and having an intermingled portion in which at least a portion of a first winding is intermingled with at least a portion of at least a second winding, wherein each full turn of each winding in said intermingled portion is effected by one self-crossing and two crossings of each other winding having turns in said intermingled portion.

In a transformer having a first winding and a second winding, both windings having the same number of turns, the intermingled region preferably comprises substantially the whole of both windings.

In a transformer having a first winding and a second winding, the first winding having a greater number of turns than the second winding, excess turns of the first winding can encompass the intermingled region and/or be encompassed by the intermingled region.

A transformer may have an intermingled region including turns of three or more windings.

According to the present invention there is provided an integrated circuit including a substantially planar transformer according to the present invention.

Preferably, the turns of said transformer are formed from a plurality of stacked conductive paths, the paths forming each winding being united by vias. More preferably, at least one of said crossings comprises first and second bridges between radially separated conductors, the bridges being between conductive paths in respective layers and crossing each other. Still more preferably, at said at least one of said crossings, the conductors in a layer which are not connected to a bridge also in that layer are chamfered to provide a terminal edge lying parallel to a side edge of the bridge in the same layer.

Preferably, uniting vias are located adjacent to said crossings.

Preferably, a lower conductor layer forming a capacitive shield at said crossings is included. More preferably, said lower conductor layer does not contain any bridges and comprises two opposed pairs of parallel fingers terminating close together under each crossing.

Preferably, a ground shield is included underlying the transformer. More preferably, the ground shield comprises a plurality of substantially radially extending fingers, the fingers being connected by a broken ring. Still more preferably, the ring is located inwards from the outer periphery of the ground shield such that the transformer's magnetic field is substantially parallel to the integrated circuit's surface at the broken ring.

BRIEF DESCRIPTION OF THE DRAWINGS

FIG. 6($a$) illustrates a layer of a crossover of the transformer of FIG. 1 and

FIG. 6($b$) illustrates a layer of a conventional crossover;

FIG. 6($c$) illustrates a layer of an alternative crossover for a transformer according to the present invention;

DETAILED DESCRIPTION OF THE PREFERRED EMBODIMENTS

Preferred embodiments of the present invention will now be described, by way of example, with reference to the accompanying drawings.

Referring to FIGS. 1, 2, 3 and 4, an on-chip planar transformer 1 is formed in metal interconnect layers of a silicon integrated circuit 2. The transformer 1 comprises a primary winding 3 of approximately one and a half turns and a similar secondary winding 4 of approximately one and a half turns.

Figure 1:
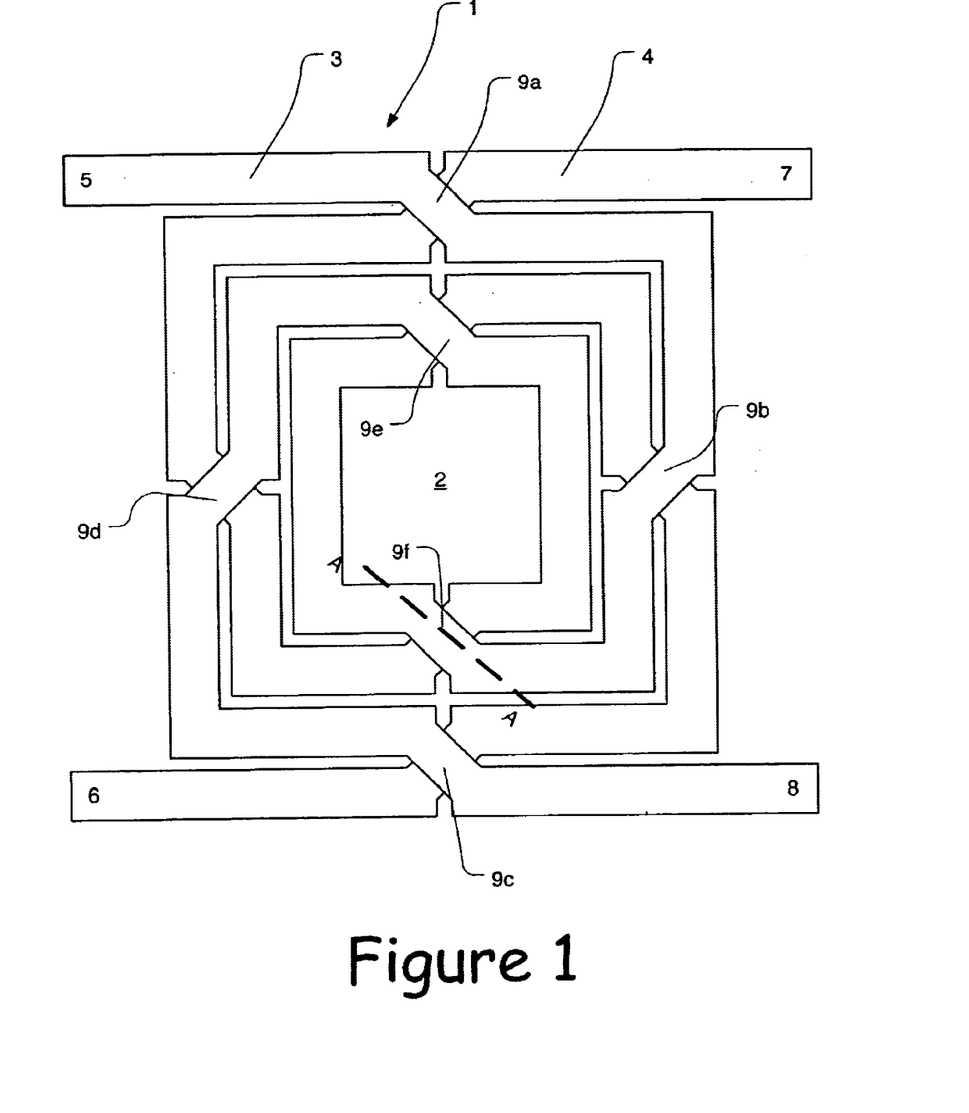
FIG. 1 is a plan view of a 1:1 ratio transformer according to the present invention.
Figure 2:
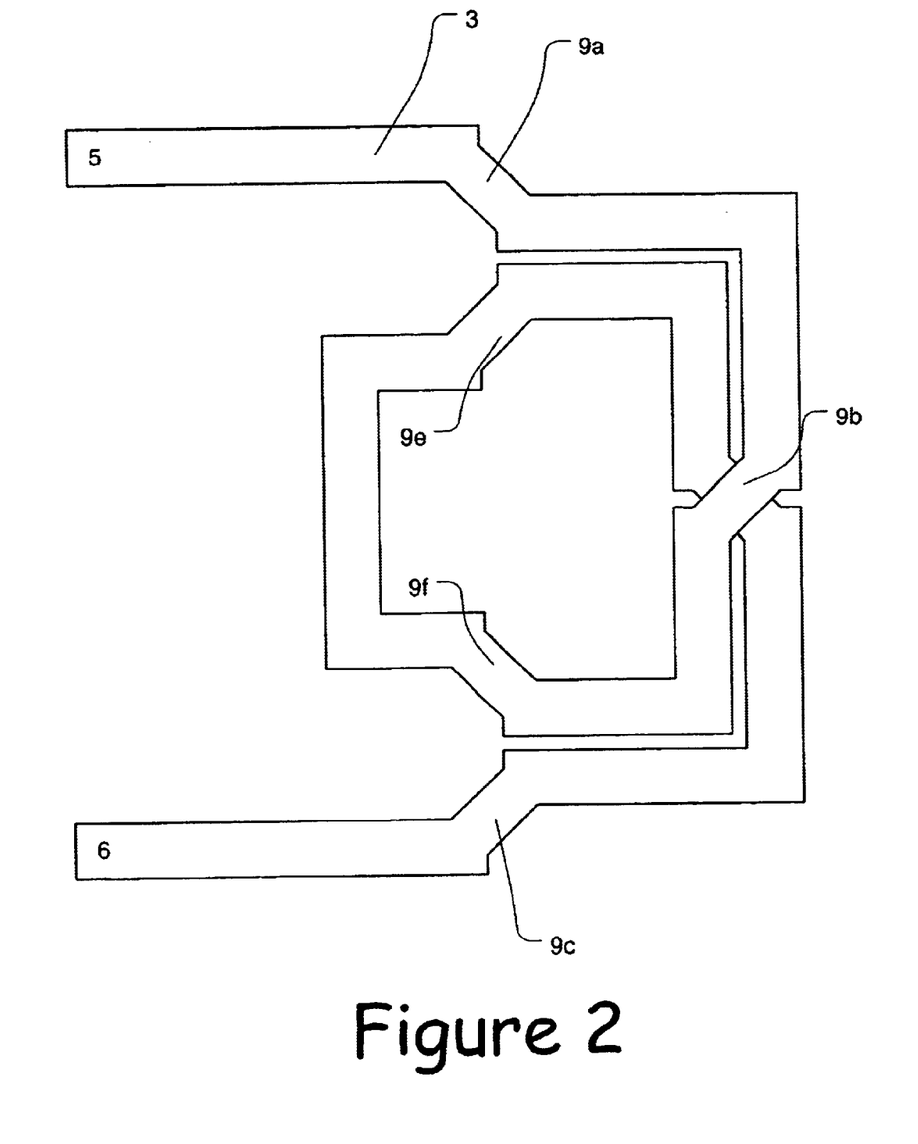
FIG. 2 is a plan view showing the primary winding only of the transformer of FIG. 1.
Figure 3:
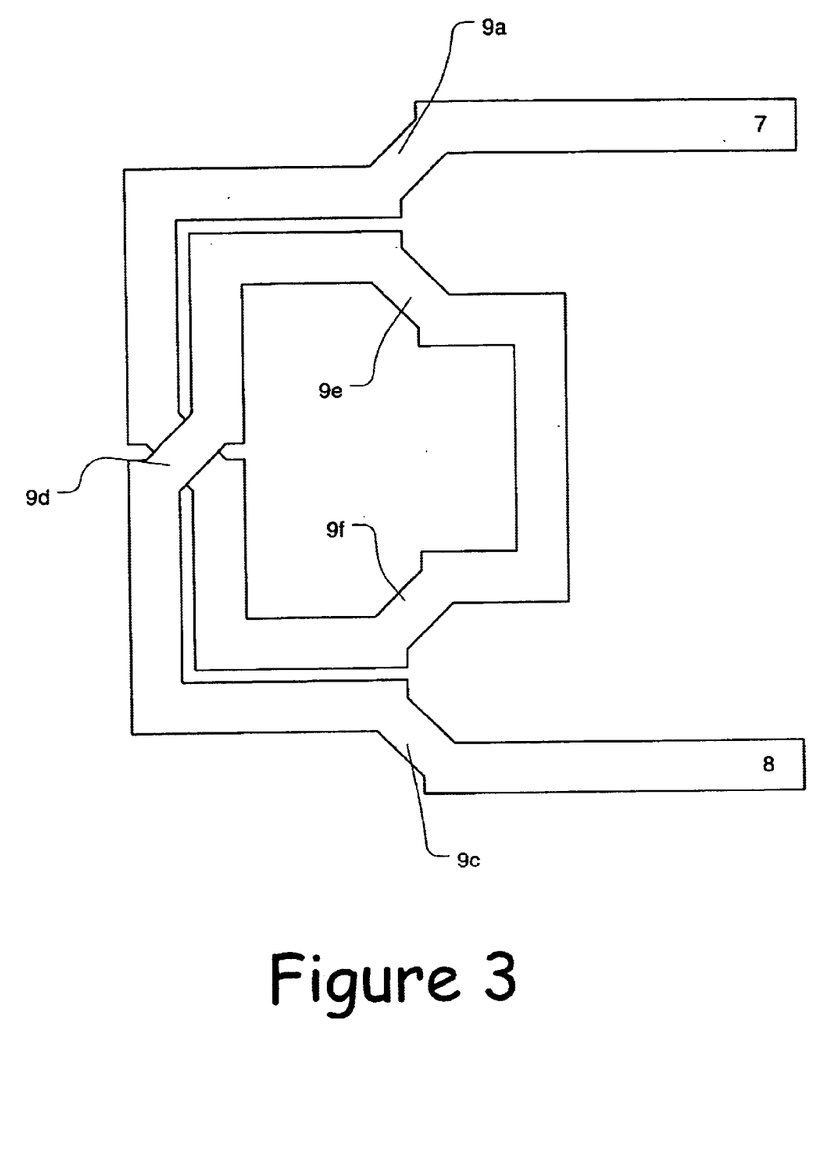
FIG. 3 is a plan view showing the secondary winding only of the transformer of FIG. 1.
Figure 4:
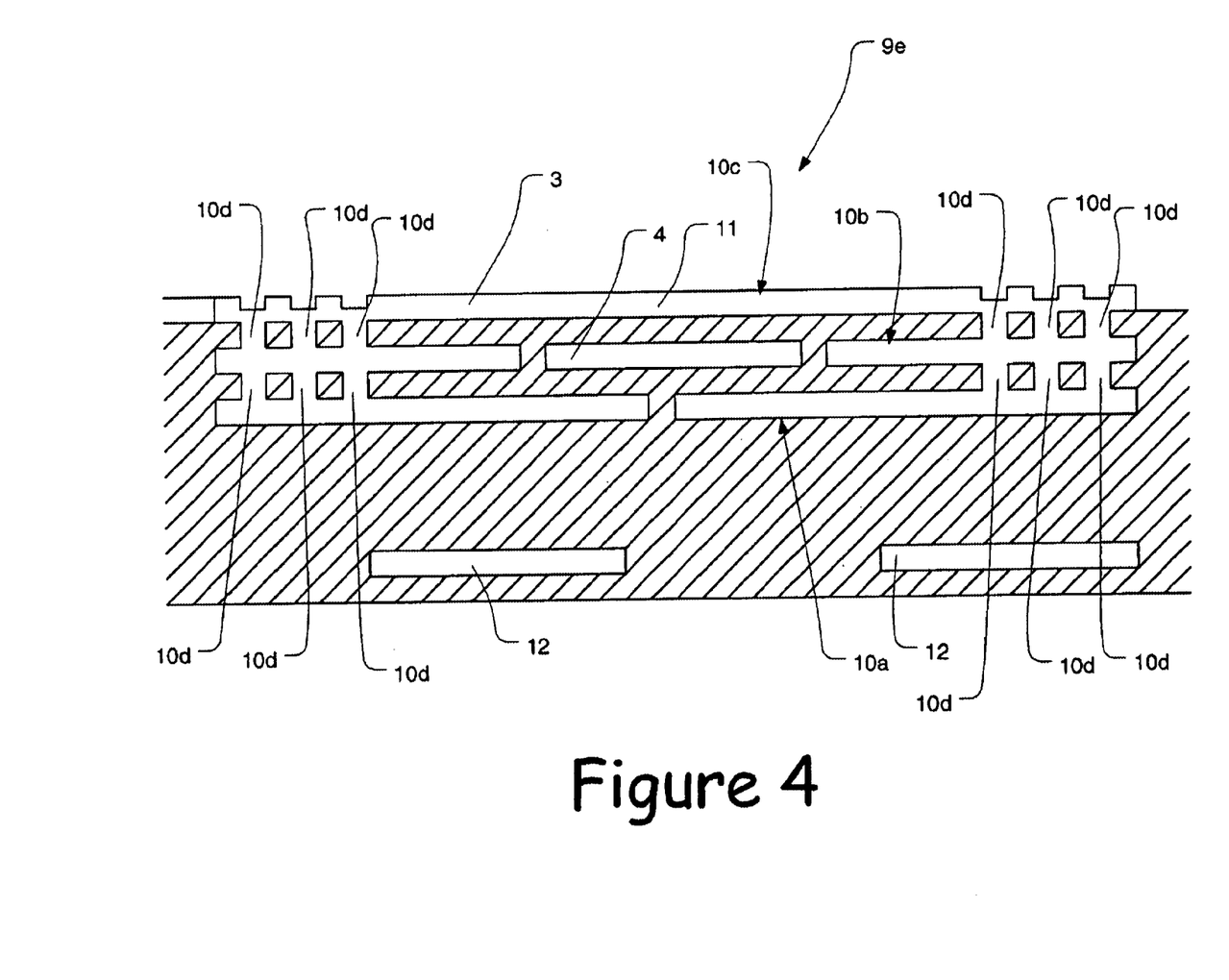
FIG. 4 is a sectional view along AA of a cross-over of the transformer of FIG. 1.

The ends of the primary winding will be referred to as first and second terminals 5, 6 respectively and the ends of the secondary winding will be referred to as third and fourth terminals 7, 8 respectively. It is to be understood that this terminology does not imply a physical break in the conductors at these points.

The transformer 1 is substantially square. The primary winding 3 spirals in from the first terminal 5 and then out to the second terminal 6. The secondary winding 4 spirals in from the third terminal 7 and then out to the fourth terminal 8 in a similar manner. It should be noted that the turns of the primary and secondary windings 3, 4 are not grouped into blocks associated with either the primary or secondary winding 3, 4 only but are entwined with each other.

The spiralling of the windings 3, 4 is achieved by crossovers 9a, . . . , 9f where they either cross themselves or the other winding. The paths crossing at these crossovers 9s, . . . , 9f swap radial positions.

Referring particularly to FIGS. 1 and 2, starting at the first terminal 5, the primary winding 3 first passes over the secondary winding 4 at the first crossover 9a. The primary winding 3 then passes through one quarter turn and over itself at the second crossover 9b. A further quarter turn on, the primary winding 3 crosses over the secondary winding 4 again. The primary winding 3 has now reached the center of the transformer 1. Half a turn after reaching the center of the transformer 1, the primary winding 3 crosses under the secondary winding 4 at the fifth crossover 9e to begin spiralling out to the second terminal 6. One quarter turn after the fifth crossover 9e, the primary winding 3 passes under itself at the second crossover 9b and, one quarter turn later, the primary winding 3 passes under the secondary winding 4 at the third crossover 9c to complete its one and a half turn extent.

Referring particularly to FIGS. 1 and 3, starting at the third terminal 7, the secondary winding 4 first passes under the primary winding 3 at the first crossover 9a. The secondary winding 4 then passes through one quarter turn, in the opposite direction to the primary winding 3 as described above, and under itself at the fourth crossover 9d. A further quarter turn on, the secondary winding 4 crosses under the primary winding 4 again. The secondary winding 4 has now reached the center of the transformer 1. Half a turn after reaching the center of the transformer 1, the secondary winding 4 crosses over the primary winding 3 at the fifth crossover 9e to begin spiralling out to the fourth terminal 8. One quarter turn after the fifth crossover 9e, the secondary winding 4 passes over itself at the fourth crossover 9d and, one quarter turn later, the secondary winding 4 passes over the primary winding 3 at the third crossover 9c to complete its one and a half turn extent.

Figure 5:
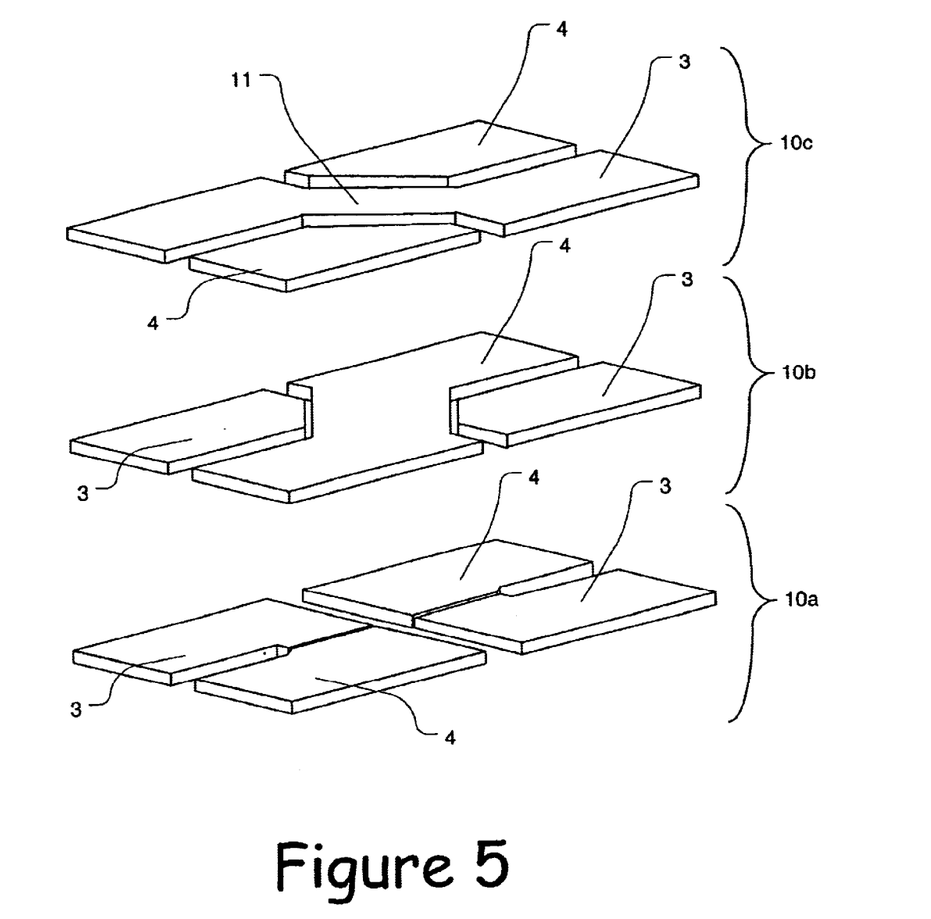
FIG. 5 is an exploded view of a cross-over of the transformer of FIG. 1.

Referring also to FIG. 5 which shows the sixth crossover 9f, the primary and secondary windings 3, 4 are each formed from tracks in three conductor (metal or polysilicon) layers 10a, 10b, 10c. SiO₂ layers (no shown) separate the conductor layers 10a, 10b, 10c. The conductors of the conductor layers 10a, 10b, 10c forming the primary winding 3 are bonded by arrays of vias 10d (see FIG. 4) adjacent to the crossovers and, optionally at other locations. Similarly, the conductors of the conductor layers 10a, 10b, 10c forming the secondary winding 4 are bonded by arrays of vias 10d (see FIG. 4) adjacent to the crossovers and, optionally at other locations.

The lowest conductor layer 10a forms a capacitive shield for enhancing the electrical symmetry between the primary and secondary windings 3, 4.

The middle and upper layers 10b, 10c are mirror images and provide the crossings for the secondary and primary windings 3, 4 respectively.

Figure 6:
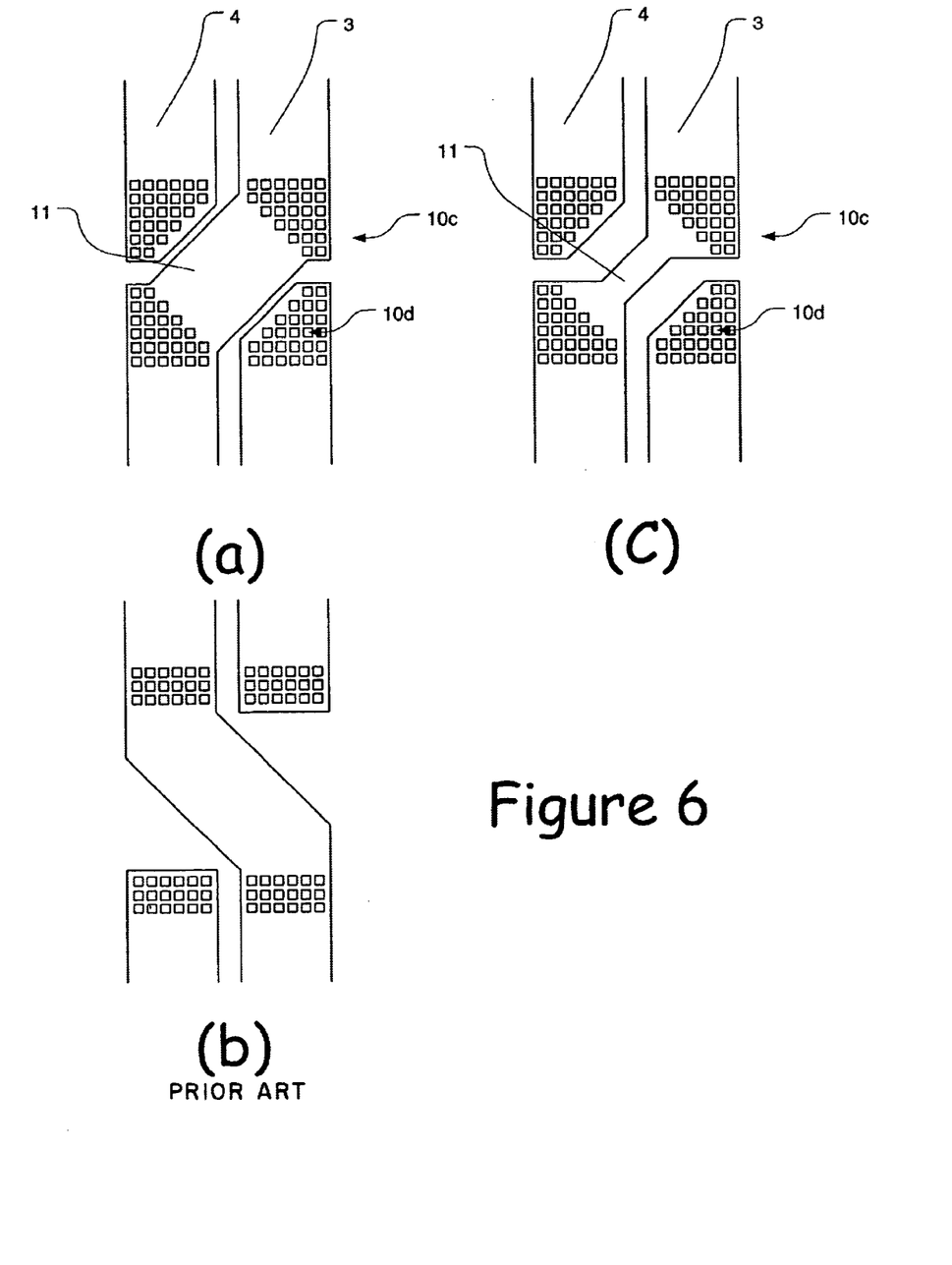

Referring also to FIG. 6a, in the upper layer 10c, the conductors of the primary winding 3 are joined by a diagonal bridge 11 and the conductors of the secondary winding 4 are chamfered to accommodate the bridge 11 and enable them to terminate much closer to the conductors of the primary winding 3 than in the conventional arrangement as shown in FIG. 6b. The conductors of the primary winding 3 are similarly chamfered in the middle layer 10b. Consequently, the length of the bridge 11, and hence its resistance, can be smaller than in the conventional arrangement. It is important to minimise the resistance of the bridge 11 because, at the crossovers, the currents of the primary and secondary windings 3, 4 are carried in respective single conductor layers 10c, 10b.

Figure 7:
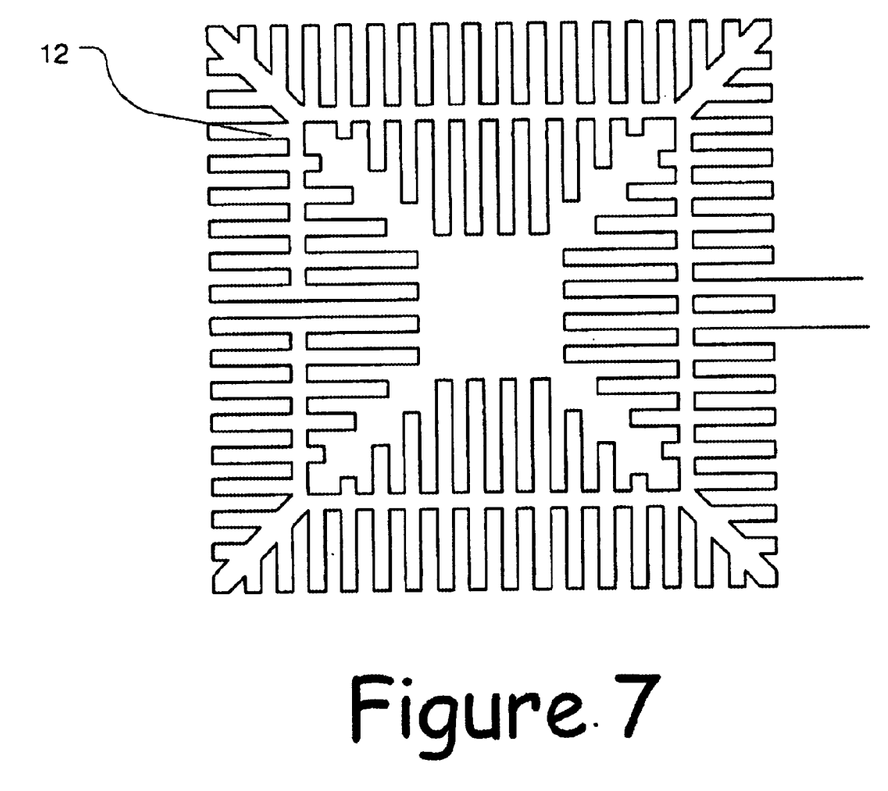
FIG. 7 is a plan view of the shield underlying the transformer of FIG. 1.

Referring to FIG. 7, the transformer 1 is underlain by a patterned ground shield 12. The ground shield 12 comprises an array of generally radially extending fingers. The fingers are connected by a broken ring 13. The broken ring 13 is positioned some distance in from the outer periphery of the ground shield 12 in a region where the transformer's magnetic field is parallel to the surface of the substrate on which the transformer 1 is formed.

Positioning the broken ring 13 in this way reduces the series resistance of the shield, when compared with a similar shield with a peripheral broken ring.

The foregoing embodiment had equal numbers of primary and secondary winding turns. However, this is not essential and the present invention can be employed in transformers having turns ratios other than 1:1. In these cases, only a portion of the turns of the winding having the larger number of turns will be entwined with those of the other winding.

Figure 8:
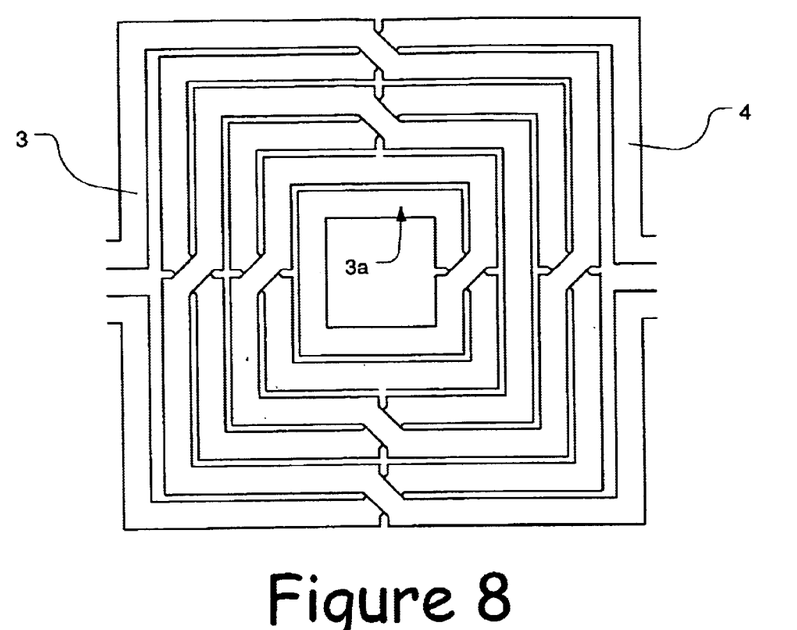
FIG. 8 illustrates a second transformer according to the present invention.

Referring to FIG. 8, a 2:1 turns ratio transformer has the additional turns 3a of the primary winding 3 which are encompassed by the region in which the primary and secondary windings are intermingled.

Figure 9:
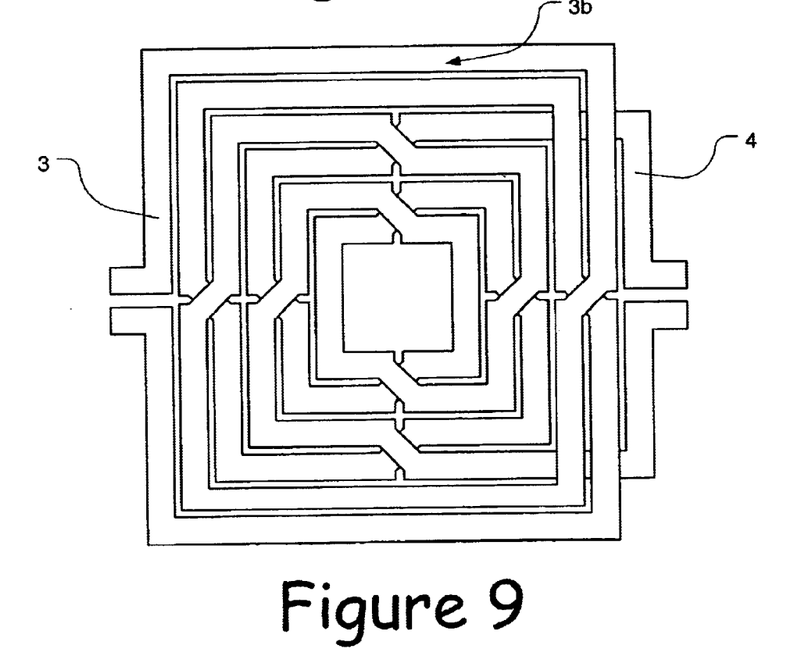
FIG. 9 illustrates a third transformer according to the present invention.

Referring to FIG. 9, the additional turns 3b of the primary winding 3 of a 2:1 turns ratio transformer encompass the region in which the primary and secondary windings are intermingled.

The present invention can also be applied to transformers having more than two windings.

Figure 10:
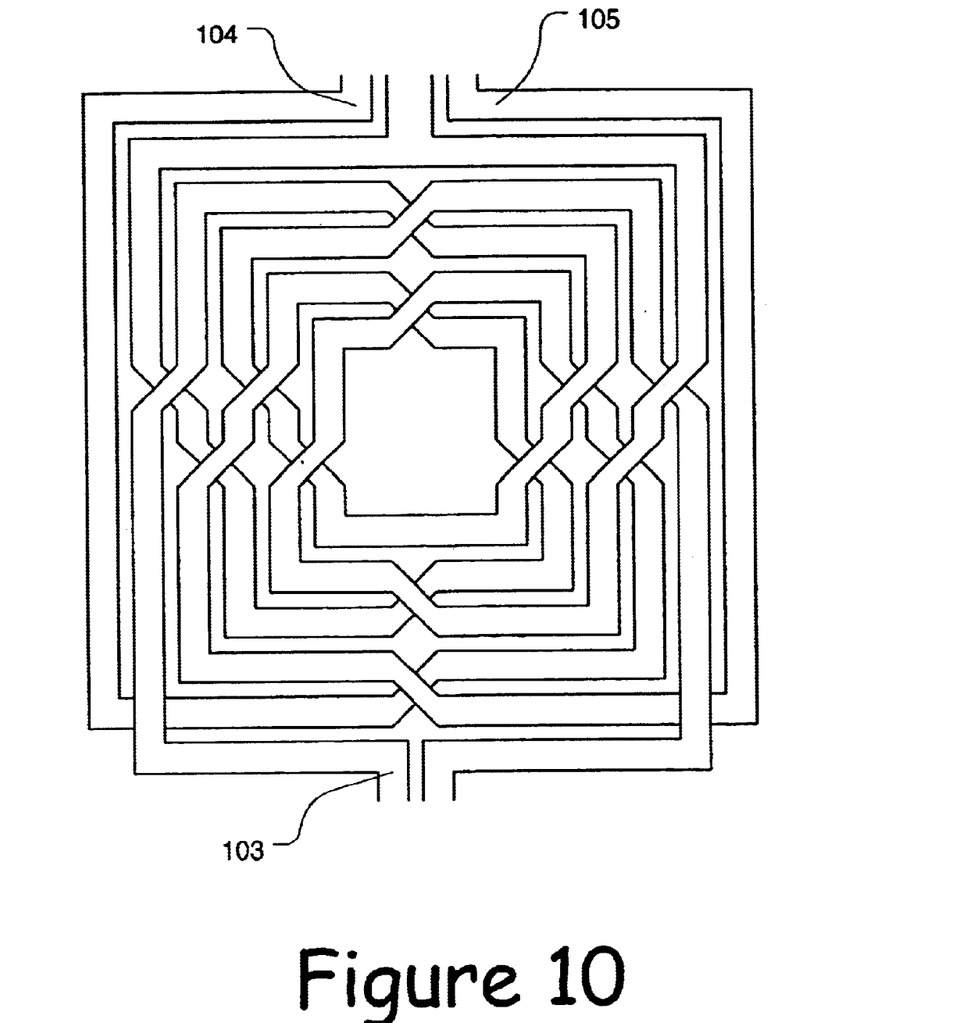
FIG. 10 illustrates a fourth transformer according to the present invention.

Referring to FIG. 10, a substantially planar transformer for use in the input of a push-pull amplifier has one primary winding 103 and two secondary windings 104, 105.

Figure 11:
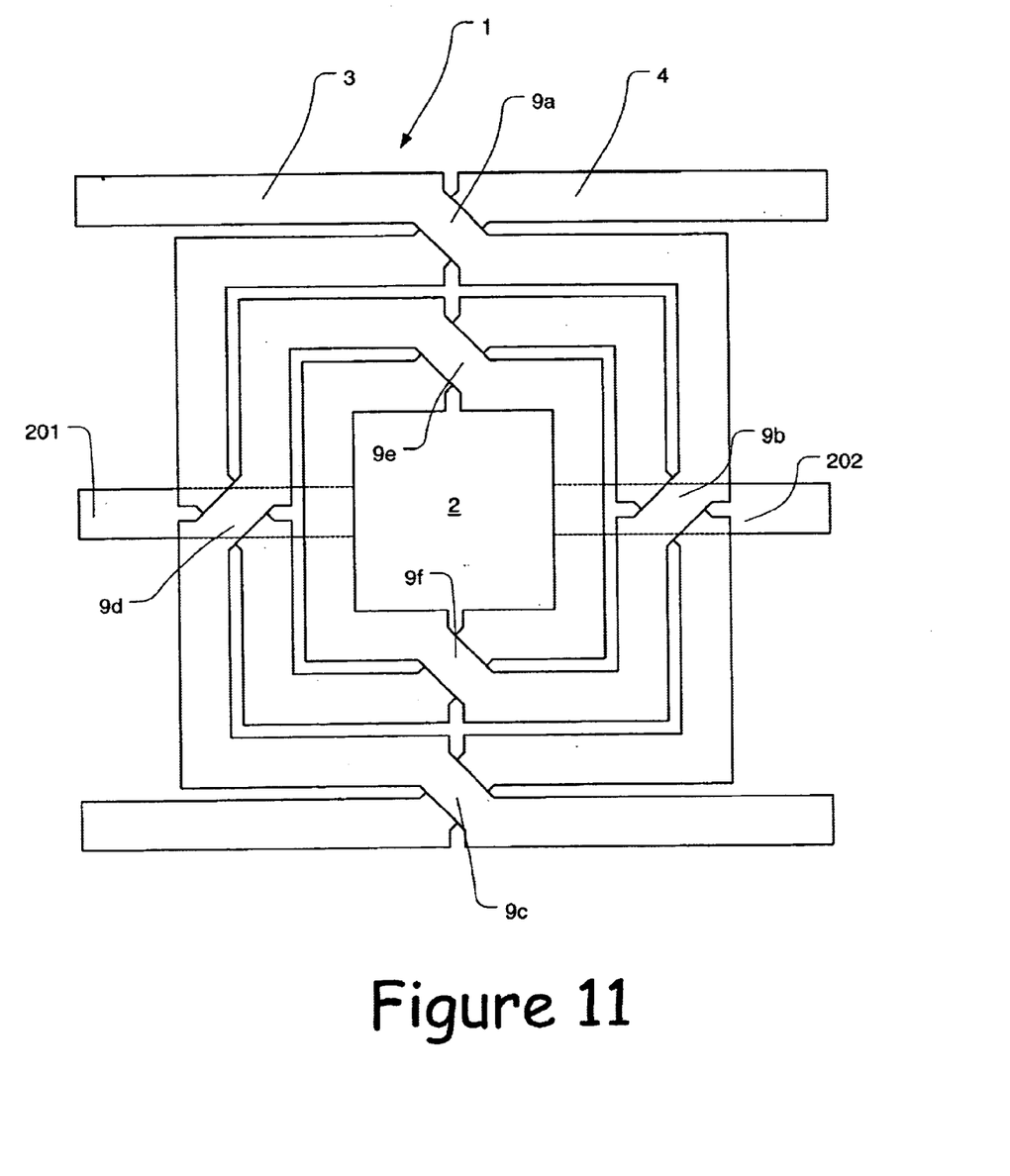
FIG. 11 illustrates a fifth transformer according to the present invention.

Referring to FIG. 11, center taps 201, 202 have been added to the primary and secondary windings 3, 4, of the transformer 1 shown in FIG. 1. The taps 201, 202 are connected to the inner turn of respective windings 3, 4 and extend radially out under the windings 3, 4 for connection to other circuit elements. Although center taps are shown, it will be appreciated that taps may be added at different points on the windings 3, 4 as circumstances require.

In the foregoing embodiments, the paths have been shown to have the same effective cross-sections. However, this need not be the case. For instance, the winding having fewer turn could be formed with a larger cross-section, by increasing the track width or increasing the number of layers used, because it will often be expected to carry a larger current.

Referring to FIG. 6(c), if the resistivites of the conductor layers differ, the widths of the bridges 11 can be made different in different layers to ensure that the resistances of the windings match. In the illustrated example, the bridge 11 has been narrowed so that its resistance matches that of a higher resistivity bridge in another layer.

As a general rule, the crossings should be positioned so as to assist in balancing the electrical properties of the windings. Arrangements having rotational or mirror symmetry are preferred for this reason.

It will be appreciated that may further modifications may be made to the described embodiments, for example the use of shapes other than square, e.g. octagons, without departing from the spirit and scope of the appended claims.

What is claimed is:

1. A substantially planar transformer comprising:

a plurality of windings and having an intermingled portion in which at least a portion of a first winding is intermingled with at least a portion of at least a second winding, wherein each full turn of each winding in said intermingled portion is effected by one crossing of said each winding over said each winding and two crossings of said each winding over each of the other windings having turns in said intermingled portion, and wherein said transformer is included in an integrated circuit which includes a ground shield having a plurality of substantially radially extending fingers connected by a broken ring.

2. A transformer according to claim 1, having a first winding and a second winding, both windings having the same number of turns, wherein the intermingled region comprises substantially the whole of both windings.

3. A transformer according claim 1, having a first winding and a second winding, the first winding having a greater number of turns than the second winding, wherein at least one of the excess turns of the first winding encompasses the intermingled region.

4. A transformer according claim 1, having a first winding and a second winding, the first winding having a greater number of turns than the second winding, wherein at least one of the excess turns of the first winding is encompassed by the intermingled region.

5. A transformer according to claim 1, having first, second and third windings.

6. A transformer according to claim 5, having an intermingled region including turns of said first, second and third windings.

7. A transformer circuit according to claim 1, wherein the transformer has an intermingled region including turns of said first, second and third windings.

8. A transformer circuit according to claim 1, wherein the turns of said transformer are formed from a plurality of stacked conductive paths, the paths forming each winding being united by vias.

9. A transformer circuit according to claim 8, wherein at least one of said crossings comprises first and second bridges between radially separated conductors, the bridges being between conductive paths in respective layers and crossing each other.

10. A transformer circuit according to claim 9, wherein the first bridge is narrower than the second bridge and the first bridge and the second bridge have substantially the same resistance.

11. A transformer according to claim 9, wherein, at said at least one of said crossings, the conductors in a layer which are not connected to a bridge also in that layer are chamfered to provide a terminal edge lying parallel to a side edge of the bridge in the same layer.

12. A transformer according to claim 8, wherein uniting vias are located adjacent to said crossings.

13. A transformer according to claim 9, including a lower conductor layer forming a capacitive shield at said crossings.

14. A transformer according to claim 13, wherein said lower conductor layer does not contain any bridges and comprises two opposed pairs of parallel fingers terminating close together under each crossing.

15. A transformer according to claim 1, wherein the broken ring is located inwards from the outer periphery of the ground shield such that the transformer's magnetic field is substantially parallel to the integrated circuit's surface at the broken ring.

* * * * *